(12) United States Patent
Sawada et al.

(10) Patent No.: US 8,367,312 B2
(45) Date of Patent: Feb. 5, 2013

(54) DETERGENT FOR LITHOGRAPHY AND METHOD OF FORMING RESIST PATTERN WITH THE SAME

(75) Inventors: Yoshihiro Sawada, Kawasaki (JP); Kazumasa Wakiya, Kawasaki (JP); Jun Koshiyama, Kawasaki (JP); Hidekazu Tajima, Kawasaki (JP); Atsushi Miyamoto, Kawasaki (JP); Tomoya Kumagai, Kawasaki (JP); Atsushi Sawano, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 461 days.

(21) Appl. No.: 12/087,545

(22) PCT Filed: Dec. 8, 2006

(86) PCT No.: PCT/JP2006/324526
§ 371 (c)(1),
(2), (4) Date: Jul. 9, 2008

(87) PCT Pub. No.: WO2007/080726
PCT Pub. Date: Jul. 19, 2007

(65) Prior Publication Data
US 2009/0004608 A1 Jan. 1, 2009

(30) Foreign Application Priority Data
Jan. 11, 2006 (JP) ................. 2006-004093

(51) Int. Cl.
*C11D 7/32* (2006.01)
*C11D 1/75* (2006.01)
(52) U.S. Cl. .......... 430/325; 510/175; 510/503; 134/1.3
(58) Field of Classification Search ................. 430/325; 510/175, 503; 134/1.3
See application file for complete search history.

(56) References Cited

U.S. PATENT DOCUMENTS

| | | | |
|---|---|---|---|
| 5,326,672 A | 7/1994 | Tanaka et al. | |
| 6,472,127 B1 | 10/2002 | Takizawa | |
| 2002/0045133 A1 | 4/2002 | Maemori et al. | |
| 2002/0115022 A1 | 8/2002 | Messick et al. | |
| 2004/0029395 A1 | 2/2004 | Zhang et al. | |
| 2005/0245422 A1 | 11/2005 | Yamada et al. | |
| 2006/0124586 A1 | 6/2006 | Kobayashi et al. | |
| 2006/0154839 A1* | 7/2006 | Ilardi et al. ..................... | 510/175 |
| 2006/0270573 A1 | 11/2006 | Ikemoto et al. | |

FOREIGN PATENT DOCUMENTS

| | | |
|---|---|---|
| JP | 05-299336 | 11/1993 |
| JP | 11-295902 | 10/1999 |
| JP | 2001-023893 | 1/2001 |
| JP | 2001-159824 | 6/2001 |
| JP | 2002-148816 | 5/2002 |
| JP | 2002-323773 | 11/2002 |
| JP | 2002-323774 | 11/2002 |
| JP | 2003-178943 | 6/2003 |
| JP | 2003-178944 | 6/2003 |
| JP | 2003-524213 | 8/2003 |
| JP | 2004-184648 | 7/2004 |
| JP | 2005-292827 | 10/2005 |
| JP | 2005-336470 | 12/2005 |
| WO | 01/63365 | 8/2001 |
| WO | 2005/076332 | 8/2005 |

* cited by examiner

*Primary Examiner* — Daborah Chacko Davis
(74) *Attorney, Agent, or Firm* — Wenderoth, Lind & Ponack, L.L.P.

(57) ABSTRACT

Conventional detergents for lithography which contain a surfactant as an active ingredient should have a reduced surfactant concentration because heightened surfactant concentrations result in dissolution of the resin component of a photoresist composition and hence in a dimensional change of a resist pattern. However, the conventional detergents have had a drawback that such a low concentration unavoidably reduces the ability to inhibit pattern falling and defect occurrence. A detergent for lithography is provided which is an aqueous solution containing (A) at least one member selected among nitrogenous cationic surfactants and nitrogenous ampholytic surfactants and (B) an anionic surfactant. This detergent retains a low surface tension even when it has a low concentration. It is effective in inhibiting pattern falling and defect occurrence. It can also inhibit resist patterns from fluctuating in dimension.

8 Claims, No Drawings

DETERGENT FOR LITHOGRAPHY AND METHOD OF FORMING RESIST PATTERN WITH THE SAME

TECHNICAL FIELD

The present invention has been made with objects to provide a cleaning solution for lithography capable of improving non-uniformity of the pattern width (LWR: line width roughness) and fine ruggedness on the side walls of the pattern (LER: line edge roughness) to improve the resolving performance of pattern along with a decrease of the defects by subjecting the image-forming light-exposed photoresist film to the development treatment followed by the cleaning treatment and prevention of pattern falling by the water rinse without inducing size changes in the pattern before and after the cleaning treatment.

BACKGROUND TECHNOLOGY

Along with the trend in recent years toward compactness and high integration of semiconductor devices, the light sources for the fine working thereof are also under a trend of gradual shift to shorter wavelength ones from traditional UV light having a long wavelength such as the g-line (436 nm), the i-line (365 nm) and the like to the KrF excimer laser (248 nm) capable of forming a resist pattern of higher pattern resolution, leading to the current ArF excimer laser (193 nm) and further electron beams such as EB, EUV and the like shifter as a major current while developments of the process and resist materials are under progress at a high pace in order to comply with these short-wavelength light sources.

Conventional photoresists are required to have: for instance, improved sensitivity, pattern resolution, heat resistance, focusing depth latitude, cross sectional profile of a resist pattern, aging stability resulting in the deterioration of the shape of the resist pattern due to contamination with amine and the like in a period between light exposure and post-exposure baking (PEB) and substrate dependency which changes are caused in the cross sectional profile of the resist pattern depending on various coating films on the silicon wafer such as insulating films including silicon nitride (SiN) films, semiconductor films including polycrystalline silicon (poly-Si) films and metallic films including titanium nitride (TiN) films. These requirements have been solved to some extent, but a defect which is a particularly important issue has problems remaining unsolved.

The defect means a mismatch between a resist pattern and the photomask pattern, which is detected when a resist pattern after having been developed is examined with a surface defect observation instrument, for instance, the mismatch like a difference between shapes of the patterns, occurrence of scums and contaminants, irregular coloring and coalescence between the patterns. The yield of the semiconductor devices decreases as the number of defects increases so that, even though the resist has the adequate resist characteristics as described above, defects make it difficult for the semiconductor devices to be effectively mass produced, while the problems thereof remain unsolved.

Besides, in recent years, it has become essential to solve the problems including resist pattern falling as a particular problem in the formation of resist patterns under the trends toward ultra-fineness and high aspect ratio. The resist pattern falling occurs under a surface tension which takes place in the step of drying of a rinse solution.

In addition, the aforementioned lithographic cleaning solution for effects of decreasing defects and suppressing resist pattern falling as the objects is further required to be capable of non-uniformity of the pattern width (LWR) and fine ruggedness appearing on the side walls of the pattern (LEW) and to be capable of improving the size changes in the undesirable variations in the dimensions of the resist pattern per se. The requirement is for a lithographic cleaning solution capable of satisfying all of these necessary characteristics.

Incidentally, in order to improve the properties of the thus obtained resist pattern, the cleaning solutions for lithography currently under use in the rinse steps to follow the development treatment include mixtures of isopropyl alcohol and water or isopropyl alcohol and Freon (JP5-299336A), aqueous solutions containing an anionic surfactant (JP2002-323773A), organic treatment solutions containing fluorine (JP2003-178943A and JP2003-178944A), a nonionic surfactant-containing rinse solution for lithography having water and ethyleneoxy group and free from any fluorine atom (JP2004-184648A) and others as the known ones.

However, mixtures of isopropyl alcohol and water or Freon are not so effective as desirable in the defect-decreasing effects. The aqueous solutions containing a surfactant are not also suitable for preventing pattern falling and decreasing the defects since the concentration of surfactant therein should be low in order to suppress the dissolution of the resinous ingredient in the photoresist while, such a limited concentration of the surfactant leads to the increased surface tension as a disadvantage.

On the other hand, there is a proposal for decreasing the defects to improve the positive-working resist composition used for the formation of patterns (JP2002-148816A) but this measure is not practicable because modification of the components of the photoresist composition must be preceded by a modification of the process per se for the supply of the components of the photoresist composition.

Further, a method is known (JP2001-23893A) for coating, in the course of resist-pattern forming, with a defect treating agent having a hydrophobic group and a hydrophilic group or, namely, with a surfactant but this method has shortages that the top portion of the resist pattern is rounded to degrade the orthogonality of the cross section and, in addition, film thickness reduction of the resist layer is caused by this treatment. Besides, a developer solution is usually supplied through a collective pipeline throughout the development treatment so that, in a semiconductor manufacturing plant wherein various resists should be used, it is necessary to exchange the treatment agent to be used corresponding to the respective resist, and to clean the device and the pipeline after each run. Consequently, this method is unsuitable.

Furthermore, there are known a method for decreasing the defects in the developing step of photolithography by using a developer solution containing a nonionic surfactant and an organic base free from metallic ions as a principal ingredient (JP2001-159824A) and a method for decreasing the defects by conducting a treatment prior to the post-exposure baking treatment by using an aqueous solution of pH 3.5 or lower containing a low-volatile aromatic sulfonic acid and having a molecular weight of at least 200 (JP2002-323774A) but no satisfactory results can still be reached.

On the other hand, a method of using a composition of a rinsing agent containing a nitrogen-containing compound with a molecular weight of 45 to 10000, which has an amino group or an imino group, and a hydrocarbon group with 1 to 20 carbon atoms in the molecule, so as to inhibit falling and damage on a resist pattern occurring in a rinsing step and a drying step (JP11-295902A) is also known, but the defect-decreasing effect mentioned above can not be obtained with such a composition of a rinsing agent. Besides, a rinse solution containing an ethylene oxide-based or propylene oxide-based activator (JP2004-184648A) is known, but the aforementioned effects of decreasing defects and inhibiting pattern falling can not be obtained because the hydrophilic group has weak interaction with water.

DISCLOSURE OF THE INVENTION

Under these circumstances, the present invention has been completed with objects to provide a novel cleaning solution for lithography capable of: overcoming the shortages in the conventional cleaning solution for lithography; maintaining a low surface tension even by decreasing the concentration of the surfactant; efficiently reducing pattern falling and defects; and further improving non-uniformity of the pattern width (LWR) and fine ruggedness on the side walls of the pattern (LER) without including size changes in the resist pattern.

In the conventional surfactant-containing cleaning solutions for lithography with an object of decreasing pattern falling and defects, there may be cases by increasing the concentration of the surfactant where the resinous ingredients in the photoresist composition are dissolved out to cause changes in the resist pattern dimensions necessitating a decrease in the concentration of the surfactant while, in a cleaning solution for lithography with a low surfactant concentration, there may be cases where a surface tension can not be reduced leading to failure of reducing pattern falling and defects as an undesirable phenomenon.

As a result of the extensive studies undertaken with an object to overcome the shortages in the use of the conventional surfactant-containing cleaning solution for lithography, the surface tension can be kept low so as efficiently to prevent pattern falling and to decrease the defects enabling prevention of dimensional variations in the resist pattern by using a cleaning solution for lithography containing at least one kind selected from nitrogen-containing cationic surfactants and nitrogen-containing amphoteric surfactants and an anionic surfactant, even if the concentration of the surfactants is low enough to prevent dissolution of the resinous ingredient in the photoresist composition.

Namely, the present invention provides: a cleaning solution for lithography comprising an aqueous solution containing (A) at least one kind selected from nitrogen-containing cationic surfactants and nitrogen-containing amphoteric surfactants and (B) an anionic surfactant and; a method for forming a resist pattern by successively undertaking the steps including
(1) a step for forming a photoresist film on a substrate,
(2) a step for subjecting the aforementioned photoresist film to selective exposure to light through a photomask pattern,
(3) a step for subjecting the aforementioned light-exposed photoresist film to post-exposure baking,
(4) a step of forming a resist pattern by subjecting the aforementioned photoresist film after the post-exposure baking to an alkaline development, and
(5) a step of bringing the resist pattern-obtained in the aforementioned step (4) into contact with the aforementioned cleaning solution for lithography.

The cleaning solution of the present invention for lithography contains, as the component (A), at least one kind selected from nitrogen-containing cationic surfactants and nitrogen-containing amphoteric surfactants and, as the component (B), an anionic surfactant.

The nitrogen-containing cationic surfactant is exemplified by, for example, amines or salt thereof, quaternary ammonium salts and amine oxides, the nitrogen atom(s) being bonded to at least one long-chain molecular chain. The amine can be any one of primary amines, secondary amines and tertiary amines. Further, the salt of amine includes hydrochlorides, hydrobromides, borates, acetates, lactates and the like.

Typical ones of the aforementioned long-chain molecular chain include saturated or unsaturated, straight-chain or branched-chain hydrocarbon groups which may optionally have aromatic rings such as benzene rings, naphthalene rings, pyridine rings and the like at the terminal or intermediate positions or which may optionally be interrupted by ether linkages, thioether linkages, amide linkages, ester linkages and the like at the intermediate position. The molecular chain interrupted by ether linkages includes a polyalkylene oxide chain and this polyalkylene oxide chain can be bonded to an aromatic group at the terminal or intermediate position.

In the aforementioned amines, amine oxides and quaternary ammonium salts, the substituent groups other than the long-chain molecular chain bonded to the nitrogen atom(s) are a lower alkyl group or a lower hydroxyalkyl group having 1 to 4 carbon atoms and such a substituent group is exemplified, for example, by a methyl group, ethyl group, propyl group, isopropyl group, butyl group, tert-butyl group, hydroxyethyl group, hydroxypropyl group and the like.

Accordingly, the nitrogen-containing cationic surfactant preferably used as the component (A) can be exemplified by: higher amines and salts thereof such as octylamine, decylamine, dodecylamine, hexadecylamine, octadecylamine, coconut-alkyl amine, soybean-alkyl amine, stearoylethylamine and oleylamideethylamine and monomethyl, dimethyl, monoethyl, diethyl, monoethanol and diethanol derivatives thereof, hydrochlorides thereof and acetates thereof and the like; quaternary ammonium salts such as cetyltrimethylammonium chloride, cetyltrimethylammonium lactate, cetyldimethylethylammonium acetate, stearyltrimethylammonium chloride, octadecyldimethylethylammonium bromide, octadecenyidimethylethylammonium chloride, octadecyldimethylbenzylammonium chloride, oleylamideethyltrimethylammonium chloride, dodecylthiomethyltrimethylammonium chloride and the like; and so on.

However, the particularly preferable nitrogen-containing cationic surfactant as the component (A) in the present invention is an amine oxide represented by the general formula

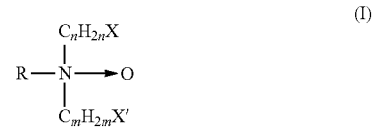

(in the formula, R is a hydrophobic molecular chain, X and X' are each H or OH and n and m are each an integer of 1 to 4).

The aforementioned hydrophobic molecular chain is preferably a higher alkyl or higher hydroxyalkyl group having 8 to 20 carbon atoms. The aforementioned lower alkyl group (X and X' in the formula each being H) is preferably an alkyl group having 1 to 3 carbon atoms such as a methyl group, ethyl group and propyl group. The lower hydroxyalkyl group (X and X' in the formula each being OH) is preferably a hydroxyalkyl group having 1 to 4 carbon atoms such as a methylol group, hydroxyethyl group, hydroxypropyl group and hydroxybutyl group. The alkyl group and hydroxyalkyl group mentioned above can be any of straight-chains or branched chains.

Further, the two lower alkyl groups (X and X' in the formula each being H) or lower hydroxyalkyl groups (X and X' in the formula each being OH) bonded to the nitrogen atom are desirably identical but may be different ones.

Accordingly, examples of the preferable amine oxides represented by the above-given general formula (I) include: long-chain alkyl di(lower alkyl) amine oxides such as octyl dimethyl amine oxide, dodecyl dimethyl amine oxide, decyl dimethyl amine oxide, cetyl dimethyl amine oxide, stearyl dimethyl amine oxide, myristyl dimethyl amine oxide, isohexyl diethyl amine oxide, nonyl diethyl amine oxide, lauryl diethyl amine oxide, isopentadecyl methyl ethyl amine oxide, stearyl methyl propyl amine oxide and the like; long-chain alkyl di(lower alkanol) amine oxides such as lauryl di(hydroxyethyl) amine oxide, cetyl di(ethanol) amine oxide and stearyl di(hydroxyethyl) amine oxide; long-chain alkyloxyalkyl di(lower hydroxyalkyl) amine oxides such as dodecyloxyethoxyethoxyethyl di(methyl) amine oxide, stearyloxylethyl di(methyl) amine oxide and the like.

These nitrogen-containing cationic surfactants can be used singly or can be used as a combination of two kinds or more.

Nextly, the nitrogen-containing amphoteric surfactants usable here include betaines including quaternary ammonium having a nitrogen atom bonded to one long-chain alkyl group having a carboxyl group at the α-position such as α-trimethylaminomyristiric betaine and dimethylamino α-(hydroxyethyl) lauric betaine, dialkylamine carboxyalkyl betaine such as N-octadecyloxymethyl-N,N-(dimethyl or diethyl)acetic betaine, dodecylthiooxymethyl dimethyl carboxymethyl betaine and the like.

Nextly, the anionic surfactant used in combination with at least one kind selected from these nitrogen-containing cationic surfactants and nitrogen-containing amphoteric surfactants is exemplified by known ones including higher fatty acid salts, higher alkylsulfate salts, higher alkylsulfonate salts, higher alkylaryl sulfonate salts, higher alcohol phosphate salts and the like, the alkyl group having 8 to 20 carbon atoms. And, the aforementioned alkyl groups can be any of straightly or branched ones. Also, the molecular chains can be interrupted by intervention of phenylene groups or oxygen atoms and can be substituted by hydroxyl groups or carboxyl groups.

Examples of the aforementioned higher fatty acid salt include alkali salts of dodecanoic acid, tetradecanoic acid, stearic acid and the like. Examples of the higher alkylsulfate salt include alkali metal salts and organic amine salts of decylsulfate and dodecylsulfate.

And, examples of the aforementioned higher alkylsulfonate salt include ammonium salts and organic amine salts of higher alkylsulfonic acids such as decanesulfonic acid, dodecanesulfonic acid, tetradecanesulfonic acid, stearylsulfonic acid and the like.

In the next place, examples of the higher alkylarylsulfonate salt include ammonium salts and organic amine salts of alkylarylsulfonic acid such as dodecylbenzenesulfonic acid and decylnaphthalenesulfonic acid.

Examples of the higher alcohol phosphate salt include, for example, ammonium salts and organic amine salts of higher alkylphosphates such as palmitylphosphate, castor oil-alkylphosphate, coconut-alkyl phosphates and the like.

Particularly preferable ones of this anionic surfactant include sulfuric acid esters, sulfonic acid esters and phosphoric acid eaters containing an alkylene group or polyalkyleneoxide group of 8 to 10 carbon atoms as a neutralized form.

In the present invention, a preferable solvent for dissolving at least one kind selected from the nitrogen-containing cationic surfactants and amphoteric surfactants and the anionic surfactant is only water but it is optional to employ a mixture solvent of water and a water-miscible organic solvent, if so desired. The water-miscible organic solvent used in this case is preferably a monohydric or polyhydric alcoholic organic solvent.

The aforementioned monohydric alcohol suitable for use is exemplified by methanol, ethanol and propanol, the polyhydric alcohol suitable for use is exemplified by ethyleneglycol, propyleneglycol, diethyleneglycol and glycerin as well as alkyl etherified or esterified products thereof.

The content of the aforementioned water-miscible organic solvent is selected in the range usually from 0.01 to 10% by mass or, preferably, from 0.1 to 5% by mass relative to the overall mass of the mixture solvent.

By using the aqueous solvent admixed with such a water-miscible organic solvent, in the treatment of a wafer of 300 mm diameter or a larger size, the cleaning solution for lithography can be efficiently dispersed and spread over the surface thereof.

It is preferable in the inventive cleaning solution for lithography that at least one kind of the nitrogen-containing cationic surfactants and the nitrogen-containing amphoteric surfactants selected from the above exemplified ones as the component (A) and the anionic surfactants selected from the above exemplified ones as the component (B) are compounded in the mass contents of 1 ppm to 1% by mass, preferably, 10 ppm to 1000 ppm, more preferably, 30 ppm to 300 ppm or, particularly preferably, 30 ppm to 200 ppm of the component (A), 1 ppm to 1% by mass, preferably, 10 ppm to 2000 ppm, more preferably, 50 ppm to 1000 ppm or, particularly preferably, 200 ppm to 700 ppm of the component (B) relative to the overall mass amount of the cleaning solution for lithography with the proviso that the mass ratio of the component (A) to the component (B) is in the range from 100:1 to 1:100. This mass ratio of the two components can be modified depending on the object of their use. It is possible by taking the compounding amounts of the two components within the above specified ranges to accomplish decrease of the defects, prevention of pattern falling and prevention of size changes of the resist pattern over all of the resist properties.

It is optional according to desire that the inventive cleaning solution for lithography further contains, in addition to at least one kind selected from the nitrogen-containing cationic surfactants and nitrogen-containing amphoteric surfactants and the anionic surfactant, a water-soluble polymer. The water-soluble polymer includes polymers of the monomers such as vinyl imidazole, vinyl imidazoline, vinyl pyrrolidone, vinyl morpholine, vinyl caprolactam, vinyl alcohol, hydroxyl alkyl esters of acrylic acid or methacrylic acid and the like as well as copolymers thereof. It is suitable that the water-soluble polymer has a mass-average molecular weight in the range of 500-1500000 or, preferably, 1000-50000.

The compounding amount of the water-soluble polymer is selected in the range of 0.1 ppm to 10% by mass or, preferably, 10 ppm to 5% by mass relative to the overall mass of the cleaning solution for lithography.

It is optional according to desire that the inventive cleaning solution for lithography is admixed with an organic carboxylic acid to be rendered acidic with a pH of 6 or lower or admixed with a lower amine compound or a lower quaternary ammonium hydroxide to be rendered basic with a pH of 8 or higher. Addition of such compounds has an effect of preventing over-time degradation of the cleaning solution or, namely, generation of bacteria.

The aforementioned organic carboxylic acid includes formic acid, acetic acid, propionic acid, butyric acid, isobutyric acid, glycolic acid, oxalic acid, fumaric acid, maleic acid, phthalic acid, peracetic acid, sulfuric acid, trifluoroacetic acid and the like. The organic carboxylic acid usable here also includes ascorbic acid.

Further, the aforementioned amine compound usable here includes monoethanolamine, 2-(2-aminoethoxy)ethanol and the like and the quaternary ammonium hydroxide usable here includes tetramethylammonium hydroxide, tetraethylammonium hydroxide, 2-hydroxyethyl trimethylammonium hydroxide, tetrapropylammonium hydroxide, methyl tripropylammonium hydroxide, tetrabutylammonium hydroxide, methyl tributylammonium hydroxide and the like.

The inventive cleaning solution for lithography is employed for the treatment of a substrate at the stage following the alkali development of the photoresist film on the substrate after the image forming light-exposure. The treatment is undertaken by dipping the substrate bearing the photoresist film in this treatment solution or by coating with or by spraying this cleaning solution onto the photoresist film. A treatment time of 1 to 30 seconds would be sufficient with this cleaning solution.

The inventive cleaning solution for lithography is suitable as a cleaning solution for cleaning a resist pattern obtained by:
(1) a step of providing a photoresist film on a substrate;
(2) a step of subjecting the aforementioned photoresist film to a selective light-exposure treatment through a photomask pattern;
(3) a step of subjecting the aforementioned photoresist film after the light-exposure treatment to a post-exposure baking treatment; and
(4) a step of subjecting the aforementioned photoresist film after the post-exposure baking treatment to an alkali-development treatment to form the resist pattern.

To describe these steps in more detail, the step (1), firstly, is a step for the formation of a photoresist film on a substrate.

The substrate for use is usually a silicon wafer. While silicon wafers of 8 inches or 12 inches or larger have entered or are entering practical applications, in particular, the problems of photoresist pattern falling and the problems of defects occurrence are becoming more and more important. The inventive cleaning solution for lithography is particularly effective in the process where the silicon wafers used have such a large diameter.

With regard to the photoresist composition for the formation of a photoresist film, there can be used any of known ones including, for the current lithography, those adaptable to the KrF excimer lasers (248 nm) containing a hydroxystyrene-based resin, the ArF excimer lasers (193 nm) containing an acrylic resin or a cycloolefin-based resin and the like as well as, for the future lithography, the liquid-immersion lithography under attention. With a proceeding trend in these photolithographies toward increased fineness and higher aspect ratio of the resist pattern, particular problems are noted relative to photoresist pattern falling and occurrence of defects. The present invention is applicable particularly preferably to the cases of using a silicon wafer of a large diameter under the trend of lithography.

In this step (1), a photoresist film is formed on a substrate such as a silicon wafer which is coated with a solution of a photoresist composition prepared in the aforementioned manner by a spinner and the like followed by a drying treatment.

In step (2), nextly, the photoresist film formed in step (1) is subjected to a selective light-exposure treatment through a photomask pattern to form a latent image followed by step (3) in which a post-exposure baking treatment or, namely, a PEB treatment, is undertaken. These step (2) and step (3) can be carried out in just the same manner as in the prior art method for the formation of a resist pattern by using a resist.

The photoresist film after the PEB treatment in this way is then subjected in step (4) to an alkali-development treatment. This alkali-development treatment is carried out, for example, by using an aqueous solution of tetramethyl ammonium hydroxide (referred to hereinbelow as an aqueous TMAH solution) in a concentration of 1 to 10% by mass or, preferably, in a concentration of 2.38% by mass.

It is essential in the formation of a resist pattern according to the inventive method that the aforementioned step (4) or, namely, the alkali-development treatment is followed by the subsequent step (5) in which the photoresist film should be subjected to a treatment with the aforementioned cleaning solution for lithography.

Since semiconductor devices are usually under mass production where throughput is one of important factors, the treatment time should preferably be as short as possible. Accordingly, this treatment time is selected in the range of 1 to 180 seconds.

The treatment with this cleaning solution for lithography is conducted, for example, by coating with or by spraying the cleaning solution at the resist pattern surface or by dipping the resist pattern in the cleaning solution.

In the method of the present invention, it is optional to add step (6), if so desired, which is a step for cleaning with pure water after undertaking step (5).

In the resist pattern formation, usually, one of the reasons leading to defects is that an alkali-insoluble ingredient in the photoresist composition precipitates out in the course of water rinse after the alkali development to be deposited on the surface of the photoresist film after formation of the resist pattern. When, in the method of the present invention, a treatment is undertaken with the inventive cleaning solution for lithography after development, the resist pattern surface is imparted with hydrophilicity so that redeposition of the alkali-dissolved matter in the photoresist onto the resist pattern surface can be suppressed giving rise to an assumption that a particularly great decrease is caused in the redeposition-based defects.

BEST MODE FOR CARRYING OUT THE INVENTION

In the following, a description is given on the best mode for practicing the present invention by way of Examples but the present invention is never limited by these examples.

Incidentally, the properties described in each of the following Examples 1-4 were determined by the methods below.
(1) Rate of Defects Occurrence An 8-inch silicon wafer was coated with an antireflection film-forming agent (a product by Brewer Science, Inc., product name "ARC-29A") and subjected to a heat treatment at 215° C. for 60 seconds to form an antireflection film having a film thickness of 77 nm. The antireflection film was coated with a photoresist (a product by TOKYO OHKA KOGYO CO., product name "TARF-P7066") followed by a heat treatment at 130° C. for 90 seconds to form a photoresist film of 215 nm film thickness.

The photoresist film obtained in this way was subjected to a light-exposure treatment by using a light-exposure machine (a product by Nikon Corp., Model "Nikon NSR-S302A") followed by a heat treatment at 130° C. for 90 seconds.

Nextly, a development treatment was undertaken at 23° C. taking 60 seconds by using a 2.38% by mass aqueous solution of tetramethylammonium hydroxide to form a hole pattern having a diameter of 250 nm.

The thus prepared hole pattern was subjected to a cleaning treatment for 7 seconds at 2000 rpm by using 100 ml of a test sample of the cleaning solution for lithography followed by drying and then the number of defects generated on this resist pattern was measured by using a surface defects observation apparatus (a product by KLA Tencor Corp., Model "KLA-2351") to count the number of defects taking the number measured after the treatment using pure water as 100%.

(2) Ratio of Unfallen Patterns

A photoresist film was provided in the same manner as in (1) except that a product name "TARF-P6111" (a product by TOKYO OHKA KOGYO CO.) was used as the photoresist and then, focusing was measured under the conditions suitable for the formation of 7 lines of a 160 nm line-and-space pattern (L/S=1/1) at 3 points with displacements by +0.1 µm, 0 µm and −0.1 µm where the exposure dose was adjusted with an increment of 1 mJ within a range of 37 to 41 mJ/cm$^2$ to count the number of line patterns safe from falling in the resist pattern within the wafer surface after the cleaning treatment by using a cathetometric SEM (a product by Hitachi High-Technologies Corp., Model "S-9200") and then count the number taken the value measured after the treatment using pure water as 100%.

EXAMPLE 1

Four kinds of cleaning solutions for lithography were prepared by dissolving, in pure water, a 1:1 by mole mixture of lauryl dimethyl amine oxide (a product by NOF Corp., product name "UNISAFE A-LM") and a mixed alkyl (average number of carbon atoms 14) sulfonic acid trimethylamine salt (a product by Takemoto Oil & Fat Co.) in a concentration of 200 ppm, 300 ppm, 400 ppm or 500 ppm, respectively.

Table 1 shows the defects occurrence rates and the unfallen pattern ratios with these cleaning solutions.

TABLE 1

| No. | Concentration of cleaning solution | Rate of defects occurrence (%) | Ratio of unfallen patterns (%) |
|---|---|---|---|
| 1 | 200 ppm | 3.47 | 300 |
| 2 | 300 ppm | 0.85 | 320 |
| 3 | 400 ppm | 0.37 | 400 |
| 4 | 500 ppm | 0.30 | 450 |

EXAMPLE 2

Two kinds of cleaning solutions for lithography were prepared by dissolving, in pure water, a 4:1 or 3:2 by moles mixture of lauryl dimethyl amine oxide (LDMO) and a mixed alkylsulfonic acid trimethylamine salt (ASTMA) in a concentration of 400 ppm, respectively. Table 2 shows the defects occurrence rates and the unfallen pattern ratios with these cleaning solutions.

TABLE 2

| No. | LDMO/ASTMA | Rate of defects occurrence (%) | Ratio of unfallen patterns (%) |
|---|---|---|---|
| 1 | 4/1 | 0.30 | 800 |
| 2 | 3/2 | 0.34 | 300 |

EXAMPLE 3

A cleaning solution for lithography was prepared by dissolving, in pure water, a 1:1 by mole mixture of dimethyl myristyl amine oxide (a product by NOF Corp, product name "UNISAFE A-MM") and the same mixed alkylsulfonic acid trimethylamine salt as used in Example 1 in a concentration of 300 ppm. Table 3 shows the defects occurrence rate and the unfallen pattern ratio with this cleaning solution.

EXAMPLE 4

A cleaning solution for lithography was prepared by dissolving, in pure water, a 1:1 by mole mixture of polyethylene glycol lauryl amine (a product by NOF Corp., product name "NYMEEN L-207") and the same mixed alkylsulfonic acid trimethylamine salt as used in Example 1 in a concentration of 300 ppm. Table 3 shows the defects occurrence rate and the unfallen pattern ratio with this cleaning solution.

TABLE 3

| Example | Rate of defects occurrence (%) | Ratio of unfallen patterns (%) |
|---|---|---|
| Example 3 | 0.54 | 363 |
| Example 4 | 0.67 | 354 |

EXAMPLES 5-11

An antireflection film having a film thickness of 77 nm was formed on an 8-inch silicon wafer by coating with an antireflection film-forming agent (a product by Brewer Science, Inc., product name "ARC-29A") followed by a heating treatment at 215° C. for 60 seconds. This antireflection film was coated with a photoresist (a product by TOKYO OHKA KOGYO CO., product name "TARF-P7145") followed by a heating treatment at 145° C. for 60 seconds to form a photoresist film of 180 nm film thickness.

The thus obtained photoresist film was subjected to a light-exposure treatment by using a light-exposure machine (a product by Nikon Corp., Model "Nikon NSR-S306C") followed by a heat treatment at 110° C. for 60 seconds.

In the next place, a development treatment was undertaken at 23° C. for 60 seconds by using a 2.38% by mass aqueous solution of tetramethylammonium hydroxide to form a hole pattern having a diameter of 130 nm.

The hole pattern prepared in this way was subjected to a cleaning treatment for 7 seconds at 2000 rpm by using 100 ml of a test solution of a cleaning solution for lithography prepared by compounding lauryl dimethyl amine oxide (a product by NOF Corp., product name "UNISAFE A-LM") and a mixed alkyl (average number of carbon atoms 14) sulfonic acid trimethylamine salt (a product by Takemoto Oil & Fat Co.) in concentrations indicated in Table 4 below followed by drying to measure the number of the defects occurred on the resist pattern by using the surface defects observation apparatus (a product by KLA Tencor Corp., Model "KLA-2351") to count the number of defects taking the value measured after the treatment using pure water as 100%. Table 4 shows the results thereof.

Furthermore, a hole pattern of 130 nm diameter formed in the same manner as above was subjected to the cleaning treatment under the same conditions as above followed by drying and the dimension of the hole pattern was determined by SEM (scanning electron microscope) to give the diameter of the hole pattern by taking the value determined after the cleaning treatment with pure water as 100%. Table 4 shows the results thereof.

TABLE 4

| Example | LDMO (ppm) | ASTMA (ppm) | Rate of defects occurrence (%) | Rate of change in pattern dimension (%) |
|---|---|---|---|---|
| Example 5 | 250 | 50 | 37 | 105.9 |
| Example 6 | 100 | 100 | 88 | 103.5 |
| Example 7 | 50 | 250 | 39 | 103.1 |
| Example 8 | 200 | 400 | 25 | 104.7 |
| Example 9 | 50 | 450 | 37 | 103.5 |
| Example 10 | 100 | 500 | 27 | 104.1 |
| Example 11 | 200 | 600 | 23 | 104.4 |

INDUSTRIAL UTILIZABILITY

The cleaning solution for lithography of the invention can be uniformly dispersed and diffused even on a large size wafer of 300 mm or larger. By the treatment of the resist pattern using the inventive cleaning solution of the invention for lithography to follow a development treatment of the resist pattern, the occurrence of pattern falling apt to occur by the cleaning treatment and generation of defects caused by the redeposition of the once dissolved resin can be decreased and, in addition, the time for dewatering in the rotary drying to follow the cleaning treatment can be greatly saved. Besides, shrinkage of the pattern caused by electron beam irradiation can be decreased by the improvement in the electron beam resistance. Improvements can be accomplished for the ruggedness in the resist pattern width generally known as the LWR (line width roughness) and fine ruggedness on the side walls of the pattern generally known as the LER (line edge roughness) resulting in improving the resolution performance of the pattern as well as an additional effect for suppression of the dimensional changes of resist pattern in the treatment with the cleaning solution.

Accordingly, the present invention can be utilized in the manufacture of semiconductor devices such as LSIs, ULSIs and others using the lithographic method.

The invention claimed is:

1. A lithographic photoresist pattern film cleaning solution which is an aqueous solution consisting essentially of components (A) and (B), wherein
    component (A) is at least one amine oxide compound, and
    component (B) is an anionic surfactant, wherein
    components (A) and (B) are contained each in a concentration of 1 ppm to 1% by mass relative to the overall mass amount of the cleaning solution, and the mass ratio of components (A) and (B) is in the range of 5:1 to 1:9.

2. The lithographic photoresist pattern film cleaning solution described in claim 1 wherein the amine oxide compound contains an alkyl group or hydroxyalkyl group having 8 to 20 carbon atoms.

3. The lithographic photoresist pattern film cleaning solution described in claim 1 wherein the component (B) is a neutralized salt composed of at least one material selected from the group consisting of higher fatty acid salts, alkylsulfates, alkylsulfonates and alkylphosphonates,
    wherein the higher fatty acid salts, the alkylsulfates, the alkylsulfonates and the alkylphosphonates have an alkyl group which is a straight chain or branched alkyl group having 8 to 20 carbon atoms, and the alkyl group is optionally substituted with a hydroxyl group or carboxyl group and is optionally interrupted by intervention of an oxygen atom or a phenylene group.

4. The lithographic photoresist pattern film cleaning solution described in claim 1 wherein the aqueous solution comprises a solvent which is water.

5. The lithographic photoresist pattern film cleaning solution described in claim 1 wherein the aqueous solution comprises two solvents which are a mixture of water and a water-miscible organic solvent.

6. The lithographic photoresist pattern film cleaning solution described in claim 1, wherein the components (A) and (B) are contained in a concentration of 10-1000 ppm and 10-2000 ppm, respectively.

7. A resist pattern forming method which successively conducts the steps comprising:
    (1) providing a photoresist film on a substrate;
    (2) subjecting the aforementioned photoresist film to a selective light-exposure treatment through a photomask pattern;
    (3) subjecting the aforementioned photoresist film after the light-exposure treatment to a post-exposure heating treatment;
    (4) subjecting the aforementioned photoresist film after the post-exposure heating treatment to an alkali development treatment to form a resist pattern; and
    (5) bringing the resist pattern obtained in the aforementioned step (4) into contact with the lithographic photoresist pattern film cleaning solution described in claim 1.

8. The method described in claim 7 wherein the step (5) is followed by a step (6) of a rinse treatment with pure water.

* * * * *